United States Patent
Wallace

(10) Patent No.: US 6,246,012 B1
(45) Date of Patent: Jun. 12, 2001

(54) ELECTROPLATED CONDUCTIVE CARBON FIBERS WITH ADHESIVE

(75) Inventor: Stanley J. Wallace, Victor, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/275,114

(22) Filed: Mar. 24, 1999

(51) Int. Cl.[7] .................. H05K 1/16; H01B 7/00
(52) U.S. Cl. .................. 174/260; 174/117 F; 174/128.1; 174/119 C; 174/254; 174/251
(58) Field of Search ............... 174/117 F, 117 FF, 174/268, 70 R, 71 R, 72 R, 72 A, 72 TR, 254, 257, 119 R, 119 C, 121 R, 251, 128.1

(56) References Cited

U.S. PATENT DOCUMENTS

| | | | |
|---|---|---|---|
| 5,139,862 | 8/1992 | Swift et al. | 428/294 |
| 5,218,171 * | 6/1993 | Aldissi | 174/128.1 |
| 5,250,756 * | 10/1993 | Swift et al. | 174/119 R |
| 5,281,771 | 1/1994 | Swift et al. | 174/262 |
| 5,354,607 | 10/1994 | Swift et al. | 428/294 |
| 5,371,324 * | 12/1994 | Kanno et al. | 174/117 F |
| 5,420,465 | 5/1995 | Wallace et al. | 204/28 |
| 5,590,465 * | 1/1997 | Santo | 29/884 |
| 5,843,567 * | 12/1998 | Swift et al. | 428/221 |

* cited by examiner

Primary Examiner—Albert W. Paladini
Assistant Examiner—Kamand Cuneo
(74) Attorney, Agent, or Firm—H. Fleischer

(57) ABSTRACT

An electrical component has at least one end adapted to be electrically connected to another component. The electrical component includes a support with a plurality of electrically conductive fibers having at least a portion thereof extending outwardly therefrom. The free end of the conductive fibers has a metal electroplated thereon to facilitate soldering of the electrical component to a printed circuit board. The other ends of the fibers have conductive adhesive bonded thereto.

11 Claims, 3 Drawing Sheets

ELECTROPLATED CONDUCTIVE CARBON FIBERS WITH ADHESIVE

This invention relates generally to electrically conductive carbon fiber composites having a metal electromotively coated thereon to facilitate the electrical connection of composites to another electrical component.

Extensive effort has been expended recently in investigating various ways to make reliable electrical connections to pultruded carbon composites. Inasmuch as they are solid members, they usually require a connection scheme that includes crimping, application of conductive adhesives, or driving a connection pin into them. It is highly desirable to be able to solder the solid composite to a printed circuit board.

Carbon fiber composites, sometimes referred to as distributed filament contacts, are used in electrophotographic printing machines to make electrical connections, for example to rotating elements. Heretofore, the electrical connections have been made by mechanical means rather than by soldering the pultruded carbon fibers to a printed circuit board. Pultruded carbon fibers have been used for various types of devices.

The following disclosures may be relevant to certain aspects of the present invention:

U.S. Pat. No. 5,139,862

Patentee: Swift et al.

Issued: Aug. 18, 1992

U.S. Pat. No. 5,281,771

Patentee: Swift et al.

Issued: Jan. 25, 1994

U.S. Pat. No. 5,354,607

Patentee: Swift et al.

Issued: Oct. 11, 1994

U.S. Pat. No. 5,420,465

Patentee: Wallace, et al.

Issued: May 30, 1995

The previously-identified patents may be briefly summarized as follows:

U.S. Pat. No. 5,139,862 describes a carbon fiber brush which may be used for electrically contacting a rotating member.

U.S. Pat. No. 5,281,771 discloses a multilayer wiring board in which fibrillated portions of pultruded carbon fibers contact the conductive portions of the first and second wiring boards.

U.S. Pat. No. 5,354,607 describes pultruded carbon fibers used as a static eliminator.

U.S. Pat. No. 5,420,465 discloses electronic switches and sensors having pultruded carbon fiber contact members.

Pursuant to features of the present invention, there is provided an electrical component having one end adapted to be electrically connected to another component. The electrical component includes a support and a plurality of electrically conductive surrounded by the support. The support has an end that is adapted to contact the other component with the end having a metal electroplated thereon.

In accordance with another aspect of the present invention, there is provided a wiring assembly including a wiring board, a support, and a plurality of electrically conductive fibers. The electrically conductive fibers are surrounded by the support. The support has an end adapted to be electrically connected to the wiring board. The end of the support connected to the wiring board has a metal electroplated thereon.

Other aspects of the present invention will become apparent as the following description proceeds and upon reference to the drawings, in which.

While the present invention will hereinafter be described in connection with a preferred embodiment and method of use thereof, it will be understood that it is not intended to limit the invention to that embodiment or method of use. On the contrary, it is intended to cover all alternatives, modifications, and equivalents that may be included within the spirit and scope of the invention as defined by the appended claims.

Figure 1:
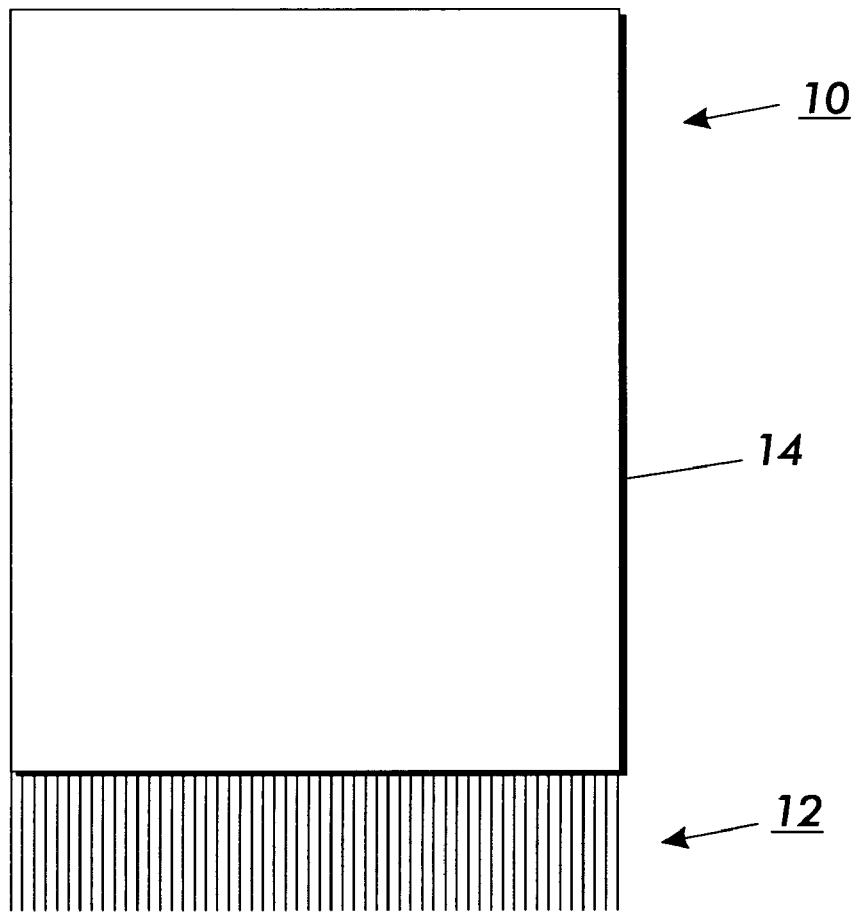
FIG. 1 is a schematic elevational view showing the electrical component of the present invention.

Turning initially to FIG. 1, electrical component 10 includes a multiplicity of carbon fibers 12 extending outwardly from support 14. Preferably, support 14 is a resin matrix surrounding carbon fibers 12. This results in a multiplicity of carbon fibers being contained within the resin matrix with their free ends being exposed to provide an electrical connection. Any suitable resin matrix may be employed. Typically, the polymer selected for the resin is chosen from the group of structural thermoplastic and thermosetting resins. Polyesters, epoxies, vinyl esters, polypropylene and Nylon are, in general, suitable materials with polyesters and vinyl esters being preferred polymers due to their short cure time, relative chemical inertness, and suitability for laser processing. The carbon fibers have an electrical resistance ranging from about $10^{-5}$ to about $10^{10}$ ohm-cm. The carbon fiber component formed by these fibers ranges from about 10 to about 15 mm wide, and is about 7 mm long and ranges from about 3 mm to about 5 mm thick. From about 20% to about 99.9% of the fiber length is enclosed by support 14.

Figure 2:
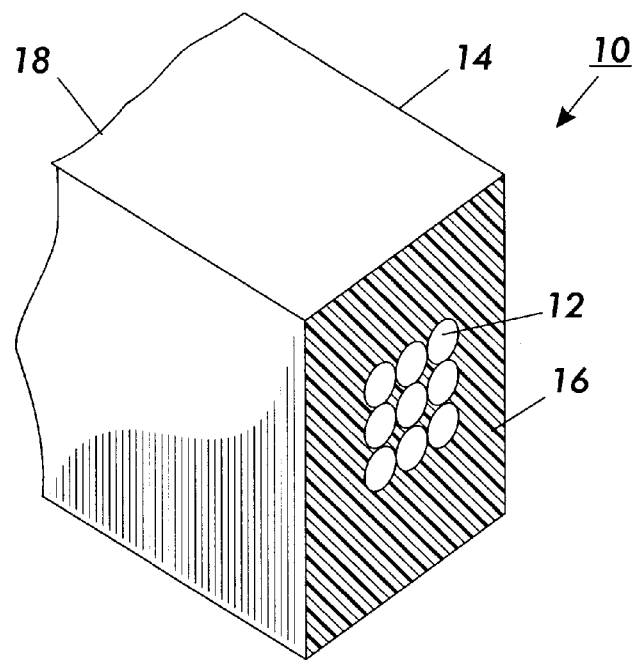
FIG. 2 is a perspective view of a portion of the FIG. 1 electrical component in one of its manufacturing stages.
Figure 3:
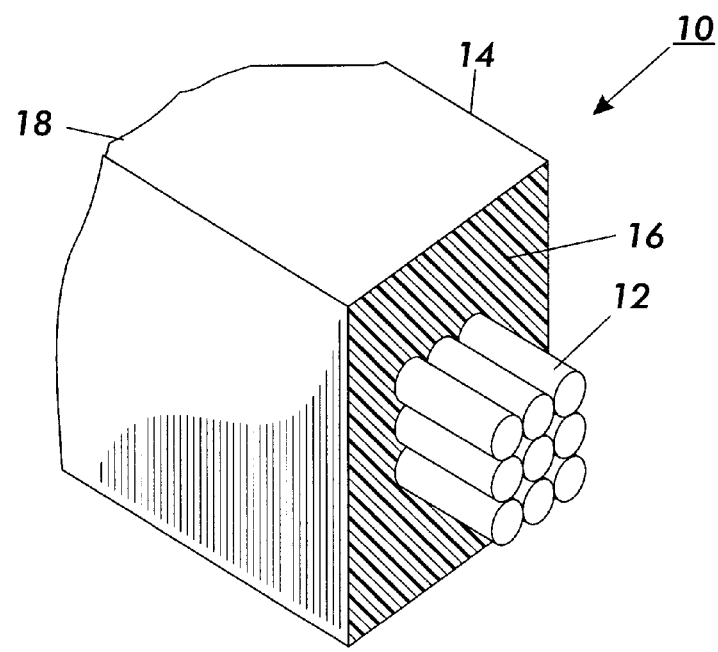
FIG. 3 is a perspective view of the FIG. 1 electrical component in another stage of its manufacture.
Figure 4:
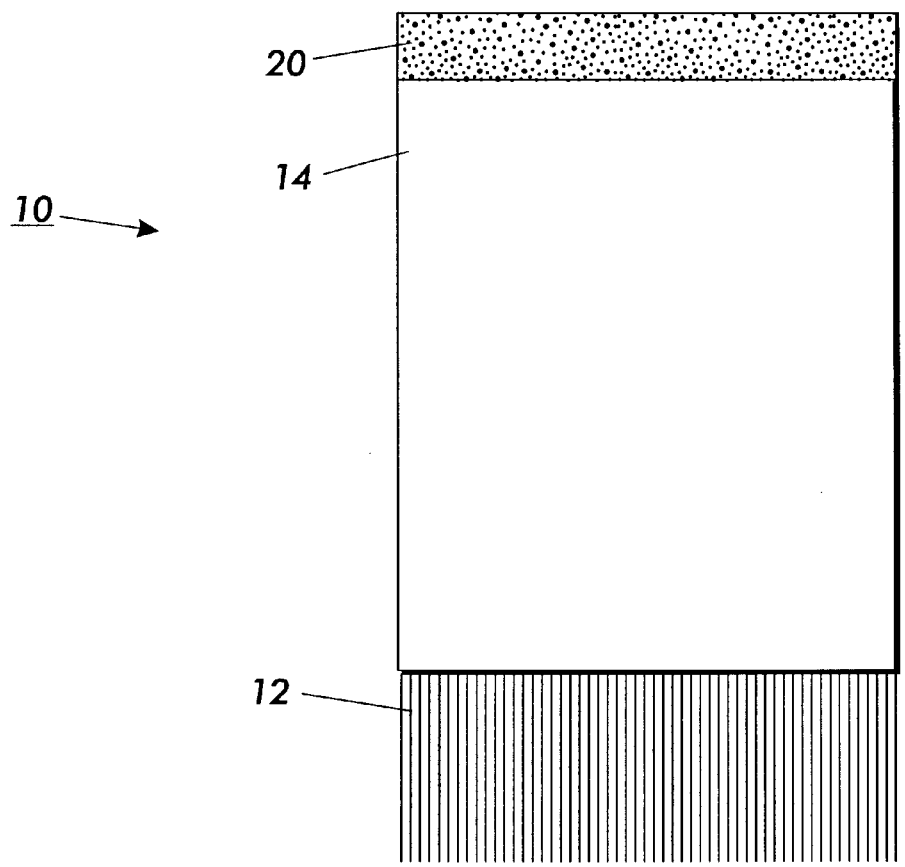
FIG. 4 is a schematic elevational view of the electrical component having a portion thereof electroplated with a metal.

Referring now to FIGS. 2 and 3, there is shown electrical component 10 during the manufacturing process thereof. With initial reference to FIG. 3, electrical component 10 is formed by an insert molding process or other suitable process. Carbon fibers 12 are encased in a resin 14 of the type heretofore described. The electrical component is then cut into two identical pieces, one of which is shown in FIG. 4, with a laser beam along the front surface 16 and the rear surface 18. Thereafter, a conductive adhesive is applied to rear surface 18 to bond fibers 12 to one another and serve as a distribution electrode. Preferably, the conductive adhesive is a thermoset type of adhesive. However, one skilled in the art will appreciate that a thermoplastic adhesive or any other suitable conductive adhesive would function satisfactorily as long as it continues to function satisfactorily at the soldering temperature.

Referring now to FIG. 3, the front face 16 is then cold cut to enable conductive fibers 12 to extend outwardly therefrom. By cold cutting, it is meant that the temperature of the carbon fibers does not exceed a maximum of 300° C., preferably 250° C. In this way, the carbon fibers are not overheated. This avoids the effect of overheating carbon fibers resulting in a decrease in the resistivity and a weakening of the mechanical properties of the wire. Both of these effects are clearly undesirable in an electrical component adapted to be used to connect to an electrical wiring board or printed circuit board. The laser operates at a wavelength ranging from about 154 nm to about 550 nm. Preferably, an excimer laser is employed which operates at a wavelength of about 248 nm. One skilled in the art will appreciate that other types of lasers may also be employed. Any of the pulsed ultraviolet laser light sources are preferable. The type of laser used must be such that cold cutting is used so as to minimize the deleterious effects on the carbon fibers.

Alternatively, with continued reference to FIG. 3, the front or contact face 16 may be cut utilizing various methods. Lasers CO2, Eximer, etc., are capable of cutting the composite resulting in a surface topology determined by many variables such as power of the laser, exposure time or beam velocity, beam shaping, such that the thermodynamics within the heat affected zone produces the correct degree of fibrillation. Fibrillation refers to the length of the fibers left after the resin binder has been thermally removed by the light beam. The melting temperature of the PAN based carbon fibers is on the order of 800° C., while the binder resin melting temperatures are in the range of 300° C. to 400° C. Cutting parameters are tailored depending on the ratio of the melting temperatures of the resin to that of the fibers. Generally speaking, thermal matrix material removal processes result in "soft" contact surfaces. If a "hard" contact surface is desired, water jet cutting may be used, resulting in very hard contact areas. Both the resin and the fibers have been abraded away, leaving only a minute amount of differential fiber length on the order of a few microns protruding from the surface.

Referring now to FIG. 4, the pultruded carbon fibers 12 are electrically plated with copper. Thus, a metal is electroplated coated on the free end portion of carbon fibers 12. While copper is preferred, many other metals may be used, including nickel, silver, zinc, lead, arsenic, cadmium, tin, cobalt, gold, indium, iridium, iron, palladium, platinum, tellurium, tungsten, or a mixture thereof. Copper 20 is electroplated to the free end portions of the pultruded carbon fibers 12. Formation of the metal coating layer by electroplating can be achieved in a number of ways. For example, the pultruded carbon fibers can be immersed in an electrolytic bath and through suitable electrical connections, a high external voltage can be applied. Because the carbon fibers of the pultrusion are small and because the innermost fibers are surrounded by many other fibers, a large external voltage may be required. Preferably, the external voltages range from about 1 volt to about 25 volts. In this way, a continuous layer of electrodeposited metal 20 is formed on the pultruded carbon fibers 12. The thickness of the electrodeposited metal ranges from about 0.25 to about 0.75 microns and preferably is about 0.5 microns. By way of example, pultruded carbon fibers are immersed in an electrolytic bath. The electrolytic bath has suitable electrolytic metal ions, e.g., copper. Copper is then electroplated onto that portion of the pultruded carbon fibers immersed in the bath. One skilled in the art will appreciate that there are many ways of electroplating metal onto carbon fibers. This technique is described more fully in U.S. Pat. No. 4,680,093, issued Jul. 14, 1987 to Morin, the relevant portions thereof being hereby incorporated into the present application.

Figure 5:
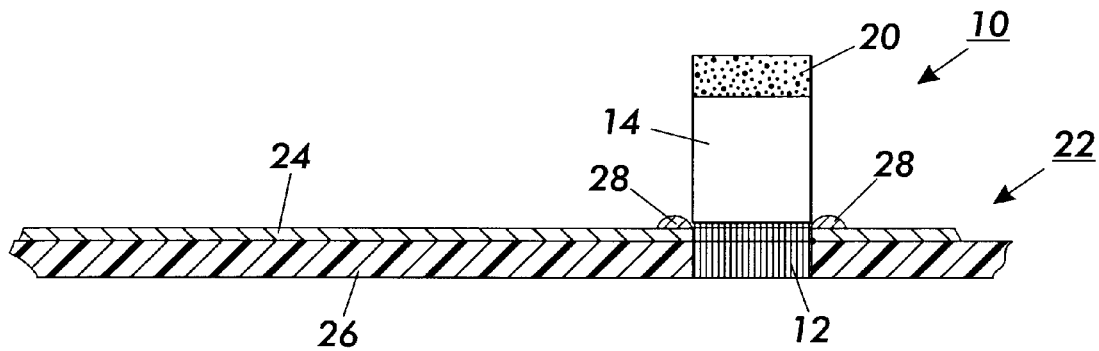
FIG. 5 is a schematic elevational view showing the electrical component of the present invention electrically connected to a printed circuit board.

Referring now to FIG. 5, there is shown electrical component 10 connected to printed circuit board 22. Printed circuit board 22 includes a plurality of wiring paths or electrical circuits formed thereon. One such representative electrical connection is depicted by the reference numeral 24. These conductive paths 24 are formed on an insulating board 26. Electrical connector 10 is soldered to circuit path 24. Connector 10 has portion 10 having copper 20 electroplated thereon inserted through a hole in circuit path 24. Solder 28 is applied to the portion 14 of connector 10 having copper 20 electroplated thereon. This ensures that there is a reliable electrical connection between electrical component 10 and circuit 24.

In recapitulation, it is clear that the electrical component of the present invention includes carbon fibers encased in a resin matrix and extending therefrom, with the carbon fibers having an electroplated metal on the free end portion thereof to facilitate soldering to an electrical circuit board.

While this invention has been described in conjunction with a preferred embodiment and method of manufacture thereof, it is evident that many alternatives, modifications and variations will be apparent to those skilled in the art. Accordingly, it is intended to embrace all such alternatives, modifications and variations that fall within the spirit and broad scope of the appended claims.

What is claimed is:

1. An electrical component having at least one end adapted to be electrically connected to another component, including:
   a support; and
   a plurality of electrically conductive fibers surrounded by said support, said conductive fibers having a first end adapted to be electrically connected to the other component with the first end thereof having a metal electroplated thereon, and a second end, opposed from the first end, having a conductive adhesive applied thereto to bond said fibers to one another.

2. An electrical component according to claim 1, wherein said fibers include carbon fibers.

3. An electrical component according to claim 2, wherein the metal includes nickel, silver, zinc, copper, lead, arsenic, cadmium, tin, cobalt, gold, indium, iridium, iron, palladium, platinum, tellurium, tungsten, or a mixture thereof.

4. An electrical component according to claim 2, wherein the metal includes copper.

5. An electrical component according to claim 3, wherein said support includes a resin material surrounding said conductive fibers.

6. A wiring assembly, including:
   a wiring board;
   a support;

a plurality of electrically conductive fibers surrounded by said support, said conductive fibers having a first end electrically connected to said wiring board with the first end thereof having a metal electroplated thereon and a second end, opposed from the first end, having a conductive adhesive applied thereto to bond said fibers to one another.

7. A wiring assembly according to claim 6, wherein said fibers include carbon fibers.

8. A wiring assembly according to claim 7, wherein the metal includes nickel, silver, zinc, copper, lead, arsenic, cadmium, tin, cobalt, gold, indium, iridium, iron, palladium, platinum, tellurium, tungsten, or a mixture thereof.

9. A wiring assembly according to claim 7, wherein the metal includes copper.

10. A wiring assembly according to claim 8, wherein said support includes a resin.

11. A wiring assembly according to claim 6, wherein the end of said support having the metal electroplated thereon is soldered to said wiring board.

* * * * *